(12) United States Patent
Motoyama

(10) Patent No.: US 7,319,850 B2
(45) Date of Patent: Jan. 15, 2008

(54) LOW NOISE BLOCK DOWNCONVERTER CONVERTING RECEIVED SIGNAL TO INTERMEDIATE FREQUENCY SIGNAL

(75) Inventor: Koji Motoyama, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 784 days.

(21) Appl. No.: 10/268,986

(22) Filed: Oct. 11, 2002

(65) Prior Publication Data

US 2003/0083034 A1    May 1, 2003

(30) Foreign Application Priority Data

Nov. 1, 2001    (JP)    ............................. 2001-336091

(51) Int. Cl.
*H04B 1/10*    (2006.01)
(52) U.S. Cl. ................... 455/307; 333/219; 455/296
(58) Field of Classification Search ................ 455/131, 455/132, 313, 307, 272, 318, 339; 333/167, 333/219
See application file for complete search history.

(56) References Cited

U.S. PATENT DOCUMENTS

| | | | |
|---|---|---|---|
| 3,271,705 A | | 9/1966 | Karkar et al. |
| 4,030,998 A | * | 6/1977 | Barrault ........................ 204/219 |
| 4,509,198 A | * | 4/1985 | Nagatomi ....................... 725/68 |
| 4,888,568 A | * | 12/1989 | Kawaguchi ................... 333/174 |
| 4,916,418 A | * | 4/1990 | Rath ............................ 333/219 |
| 5,625,894 A | * | 4/1997 | Jou .............................. 455/78 |
| 5,940,750 A | | 8/1999 | Wang |
| 6,317,016 B1 | * | 11/2001 | Kuo ............................. 333/215 |
| 6,373,445 B1 | * | 4/2002 | Kuno .......................... 343/786 |
| 6,424,817 B1 | * | 7/2002 | Hadden et al. ............. 455/3.02 |
| 6,587,018 B1 | * | 7/2003 | Meck et al. .................. 333/175 |
| 6,646,587 B2 | * | 11/2003 | Funai ........................ 342/26 R |
| 6,759,926 B2 | * | 7/2004 | Yamaguchi .................. 333/175 |
| 6,765,458 B2 | * | 7/2004 | Yamaguchi .................. 333/175 |
| 2002/0048872 A1 | * | 4/2002 | Yamaguchi .................. 438/200 |

FOREIGN PATENT DOCUMENTS

| | | |
|---|---|---|
| DE | 27 57 460 A | 6/1978 |
| JP | 63-41916 U | 3/1988 |
| JP | 01-238321 A | 9/1989 |
| JP | 02-140007 A | 5/1990 |
| JP | 05-121988 A | 5/1993 |
| JP | 10-233706 A | 9/1998 |
| JP | 2000-223986 A | 11/2000 |
| JP | 2001-016128 A | 1/2001 |

\* cited by examiner

*Primary Examiner*—Edward F. Urban
*Assistant Examiner*—Christian A. Hannon
(74) *Attorney, Agent, or Firm*—Birch, Stewart, Kolasch & Birch, LLP

(57) ABSTRACT

In a low noise block downconverter converting a right-hand (or horizontally) polarized wave signal and a left-hand (or vertically) polarized wave signal to intermediate frequency signals, one of two filters for removal of interference waves from the intermediate frequency signals on the right-hand (or horizontally) polarized wave side and on the left-hand (or vertically) polarized wave side is formed of a plurality of stages of parallel resonant trap circuits having capacitors and inductors connected in parallel, respectively, which exhibit attenuation characteristic that is wideband and steep and allows great attenuation in the reject band. Thus, it is possible to provide a low noise block downconverter employing an LPF that achieves attenuation characteristic being wideband and steep and allowing great attenuation in the reject band with the least possible number of inductor components that would otherwise increase the cost.

2 Claims, 8 Drawing Sheets

LOW NOISE BLOCK DOWNCONVERTER CONVERTING RECEIVED SIGNAL TO INTERMEDIATE FREQUENCY SIGNAL

BACKGROUND OF THE INVENTION

1. Field of the Invention

The present invention relates to low noise block downconverters, and more particularly to a low noise block downconverter in a satellite receiver receiving satellite broadcasting.

2. Description of the Background Art

FIG. 7 is a block diagram showing a configuration of a conventional satellite broadcasting receiving system. Referring to FIG. 7, a high-frequency signal in the 12 GHz band (11.45-11.70 GHz) arriving from a broadcasting satellite 100 is received by an antenna 101. Antenna 101 is provided with a low noise block downconverter (hereinafter, referred to as "LNB") 102. The weak high-frequency signal of the 12 GHz band from broadcasting satellite 100 is frequency-converted to an intermediate frequency (IF) signal of 1 GHz band and low-noise amplified by LNB 102. The resultant low-noise signal of a sufficient level is supplied to a digital broadcasting satellite (DBS) tuner 104 connected as a next stage. DBS tuner 104 processes the signal applied via a coaxial cable 103 in its internal circuit, and supplies the processed signal to a television receiver 105.

FIG. 8 is a block diagram of LNB 102 shown in FIG. 7. Referring to FIG. 8, the incoming signal in the 12 GHz band is received by an antenna probe 112 within a waveguide 111, and low-noise amplified by a low noise amplifier (LNA) 113. It is then passed through a band pass filter (BPF) 114, which allows a desired frequency band to pass and removes a signal in the image frequency band. Thereafter, the resultant signal is mixed by a mixer circuit 115 with a local oscillation signal of 10 GHz from a local oscillator circuit 116, and frequency-converted to an IF signal in the 1 GHz band (1450-1700 MHz). It is then applied to an intermediate frequency (IF) amplifier 117 to have appropriate noise and gain characteristics, and is output from an output terminal 118. LNA 113, local oscillator circuit 116, and IF amplifier 117 are provided with a power supply voltage from a power supply circuit 119.

The incoming signal from broadcasting satellite 100 has two kinds of polarized waves, i.e., H polarized wave and V polarized wave (or R polarized wave and L polarized wave). There is an LNB which frequency-converts the polarized waves separately from each other to prevent them from overlapping in the intermediate frequency band, and transmits them in one signal cable.

FIG. 9 is a block diagram showing such a band stack LNB. Referring to FIG. 9, a V polarized wave signal and an H polarized wave signal included in the incoming signal are received by a V polarized wave probe 122 and an H polarized wave probe 123, respectively, in a waveguide 121, and low-noise amplified by an LNA 124. The resultant signals are passed through respective BPF 125, 126, where desired frequency bands are passed and signals in the image frequency bands are removed. They are then applied to mixers (MIX) 127, 128, where the respective signals are mixed with local oscillation signals of 10 GHz and 10.45 GHz from local oscillator circuits 129 and 130, respectively, and converted to IF signals of 1000-1700 MHz.

The IF signal from MIX 127 and the IF signal from MIX 128 are passed through a high pass filter (HPF) 131 and a low pass filter (LPF) 132, respectively, such that they do not constitute interference components with respect to each other, and then mixed at a mixer circuit 133. The IF signal thus mixed is transmitted to and amplified at an IF amplifier 134, and is output from an output terminal 135. Power supply circuit 136 supplies power supply voltages to respective circuits.

It is now focused on LPF 132 in band stack LNB shown in FIG. 9. Since this LPF 132 needs to have attenuation characteristic that is wideband and steep and allows great attenuation in the reject band, multiple stages of series resonant trap circuits, each having an inductor L and a capacitor C connected in series as shown in FIG. 10, are connected as shown in FIG. 11 and employed.

When the series resonant trap circuits as shown in FIG. 11 are being employed, the number of stages must be increased in order to achieve the attenuation characteristic being wideband and steep and allowing great attenuation in the reject band, and inductor components La, Lb must be provided between the adjacent stages. Inductor component La, Lb would require an area when formed with a substrate pattern. It would increase the cost when a chip component is used.

SUMMARY OF THE INVENTION

Based on the foregoing, a main object of the present invention is to provide a low noise block downconverter employing a low pass filter that achieves attenuation characteristic being wideband and steep and allowing great attenuation in the reject band with the least possible number of inductor components that would otherwise increase the cost.

The present invention is a low noise block downconverter which converts a received right-hand (or horizontally) polarized wave signal and a received left-hand (or vertically) polarized wave signal to intermediate frequency signals. It includes: a first circuit which outputs the received right-hand (or horizontally) polarized wave signal; a second circuit which outputs the received left-hand (or vertically) polarized wave signal; a first local oscillator circuit which outputs a first local oscillation signal; a second local oscillator circuit which outputs a second local oscillation signal; a first mixer circuit which mixes the right-hand (or horizontally) polarized wave signal output from the first circuit and the first local oscillation signal from the first local oscillator circuit to output the intermediate frequency signal; a second mixer circuit which mixes the left-hand (or vertically) polarized wave signal output from the second circuit and the second local oscillation signal from the second local oscillator circuit to output the intermediate frequency signal; a first filter for removing interference waves from the output of the first mixer circuit; and a second filter for removing interference waves from the output of the second mixer circuit. One of the first and second filters includes a plurality of stages of parallel resonant trap circuits.

As such, according to the present invention, one of the two filters for removing interference waves from the intermediate frequency signal on the right-hand (or horizontally) polarized wave side and the intermediate frequency signal on the left-hand (or vertically) polarized wave side is formed of a plurality of stages of parallel resonant trap circuits, which exhibit attenuation characteristic that is wideband and steep and allows great attenuation in the reject band. Accordingly, it is possible to reduce the number of inductance components that would otherwise increase the cost.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
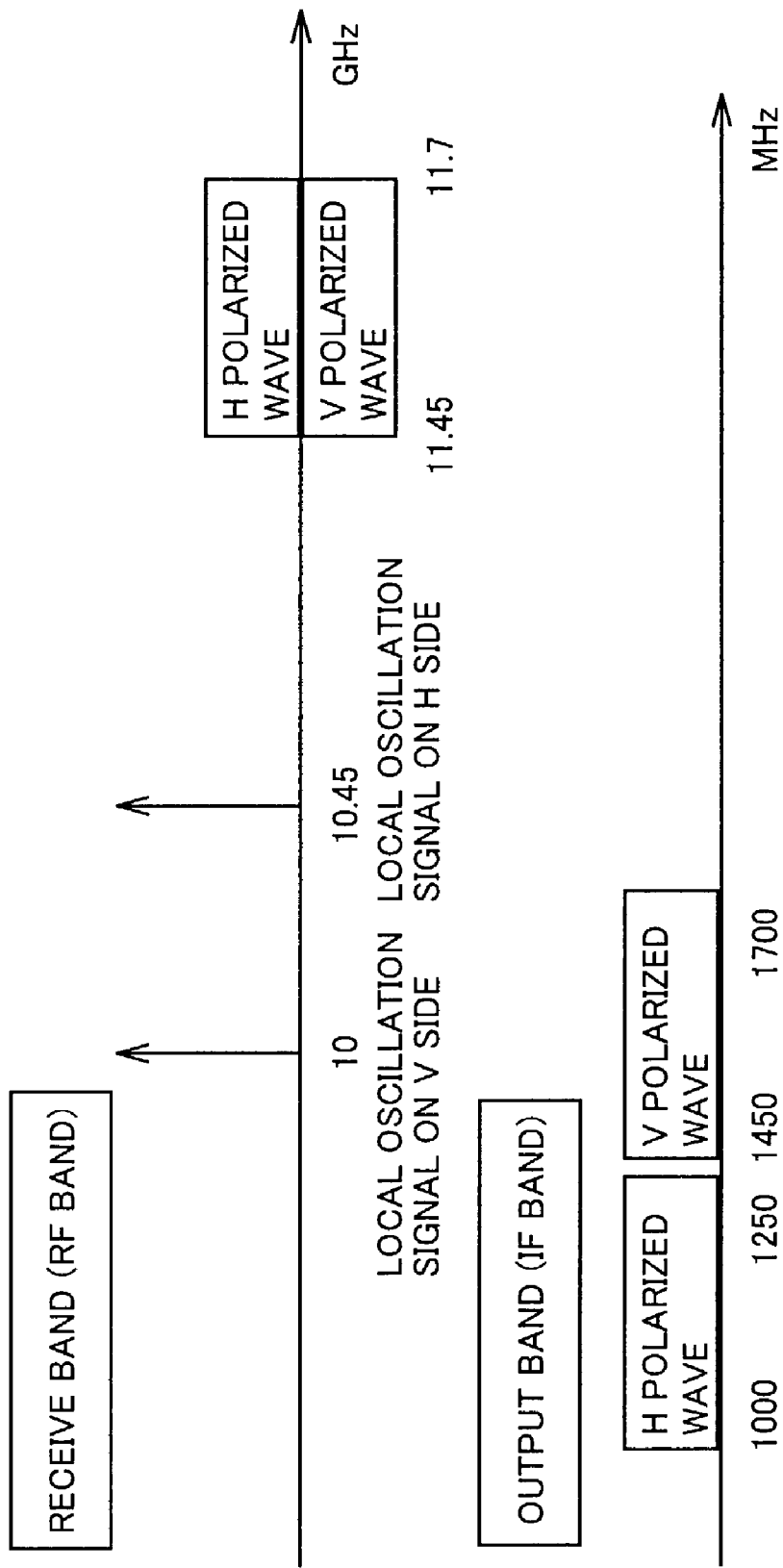
FIG. 1 shows, by way of example, transmission frequency bands of a band stack LNB to which the present invention is applied.

FIG. 1 shows by way of example the transmission frequency bands of a band stack LNB to which the present invention is applied. In the band stack LNB shown in FIG. 9, the signal of 11.45-11.70 GHz arriving from the satellite has the H polarized wave and the V polarized wave, which are mixed with local oscillation signals of 10.45 GHz and 10 GHz, respectively, by MIX. The H polarized wave and the V polarized wave are thus converted to 1000-1250 MHz and 1450-1700 MHz, respectively.

To transmit these signals in one cable, as described above, the interference components are removed by HPF and LPF, respectively, before mixing thereof. LPF in this case is inserted into a signal line on the H polarized wave side. The LPF is required to realize very steep attenuation, since the difference between the pass band and the reject band is only 200 MHz.

Figure 2:
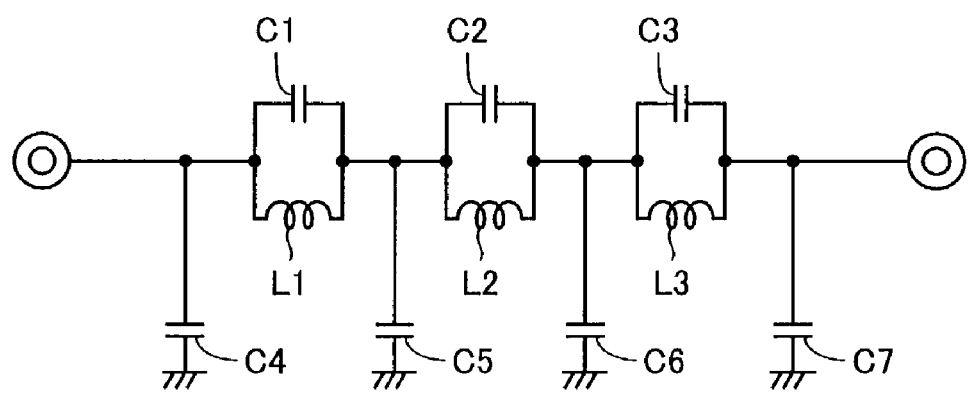
FIG. 2 shows an LPF for use in an embodiment of the present invention.
Figure 3:
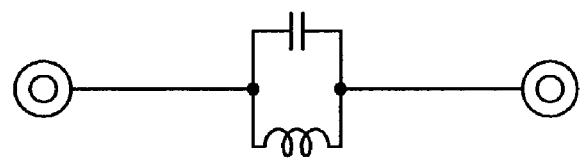
FIG. 3 shows a parallel resonant trap circuit as a component of the LPF in FIG. 2.

FIG. 2 shows an LPF used in an embodiment of the present invention, and FIG. 3 shows a parallel resonant trap circuit as a component of the LPF in FIG. 2.

Referring to FIG. 2, LPF includes three stages of parallel resonant trap circuits connected in series, each parallel resonant trap circuit having a capacitor and an inductor connected in parallel, as shown in FIG. 3. More specifically, LPF includes capacitor C1 and inductor L1, capacitor C2 and inductor L2, and capacitor C3 and inductor L3 respectively connected in parallel with each other, which are then connected in series. An inductor component is unprovided between the neighboring parallel resonant trap circuits C1/L1, C2/L2 and C3/L3. Capacitors C4, C5, C6 and C7 are connected between input/output nodes of the respective parallel resonant trap circuits and a ground.

Figure 4:
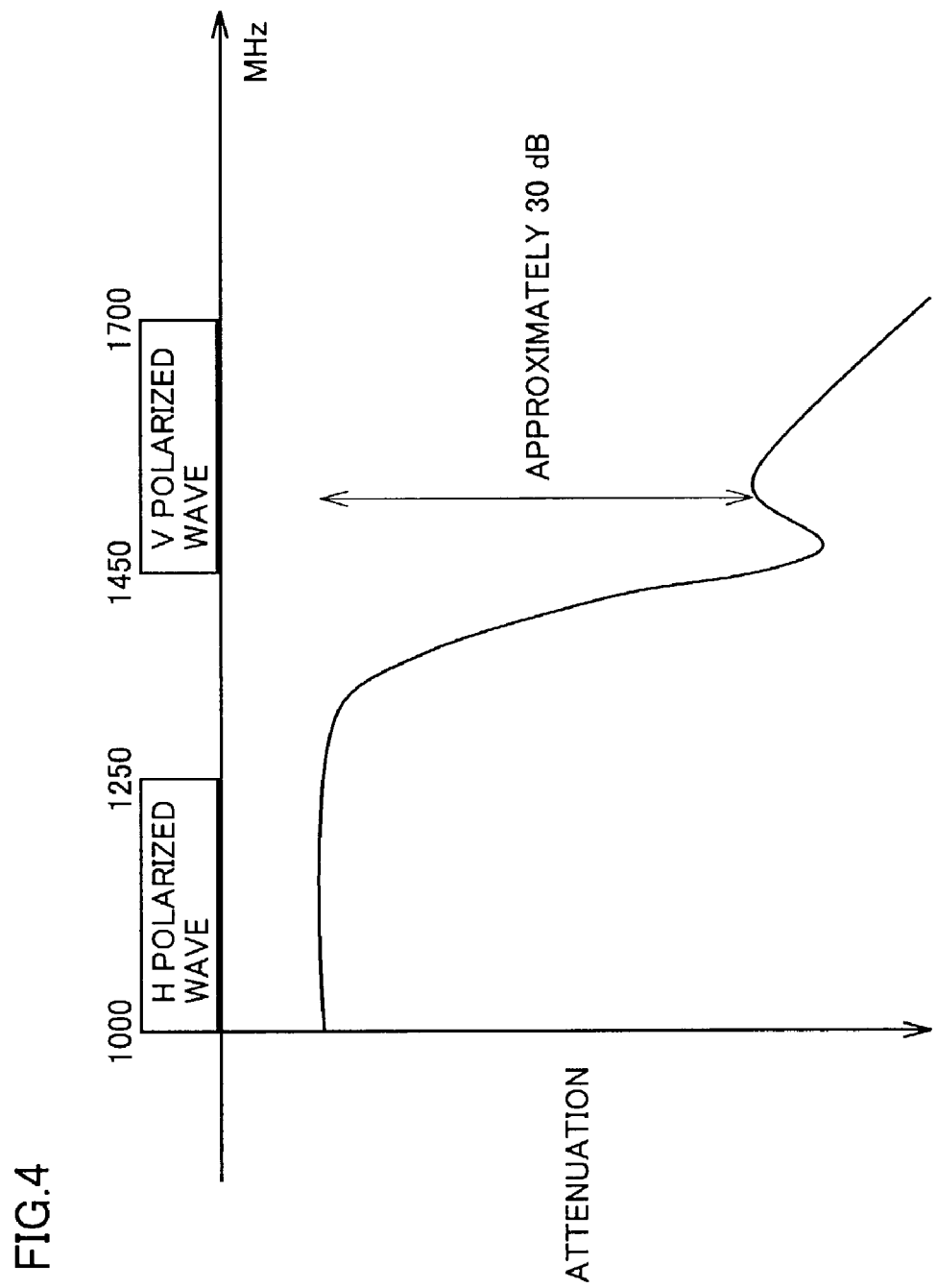
FIG. 4 shows characteristics of the LPF shown in FIG. 2.

FIG. 4 shows the characteristics of the LPF shown in FIG. 2. As shown in FIG. 4, the attenuation in the reject band of 1450-1700 MHz corresponding to the V polarized wave band is approximately 30 dB, so that desired attenuation characteristic was obtained.

Figure 11:
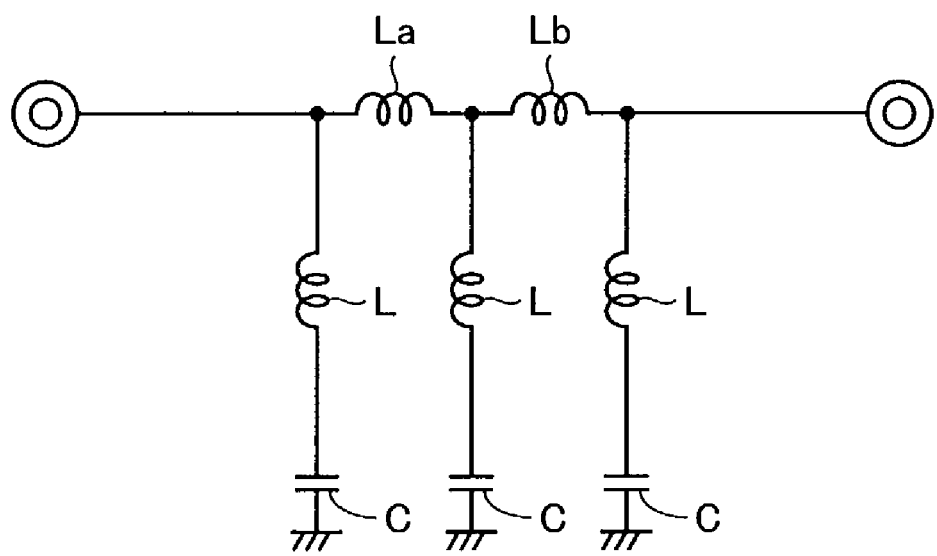
FIG. 11 shows an LPF formed of a plurality of stages of series resonant trap circuits.

In addition, the number of inductor components was reduced by 2 compared to the LPF employing the series resonant trap circuits as shown in FIG. 11. In FIG. 2, seven capacitors C1-C7 are necessary. Although it means that the number of capacitors is increased by 4 compared to the LPF in FIG. 11, the capacitor is more compact and less expensive than the inductor, so that the substrate area can be lessened and the cost can be reduced.

As such, when N trap circuits are being employed, N-1 inductor components that would otherwise be provided therebetween can be eliminated.

Figure 5:
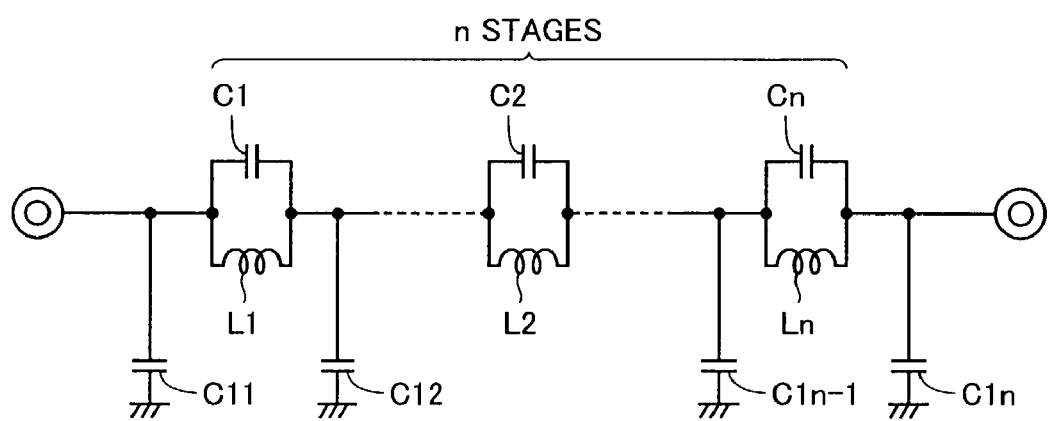
FIG. 5 shows an LPF according to another embodiment of the present invention.

FIG. 5 shows an LPF according to another embodiment of the present invention. Compared to the embodiment shown in FIG. 2 where three stages of parallel resonant trap circuits have been employed, in the embodiment shown in FIG. 5, capacitors C1, C2 ... Cn and inductors L1, L2 ... Ln are connected in parallel, respectively, to increase the number of stages to n stages, and capacitors C11, C12 ... C1n-1, C1n are connected between input/output nodes of the respective parallel resonant trap circuits and a ground. Accordingly, the attenuation becomes even steeper.

Figure 6:
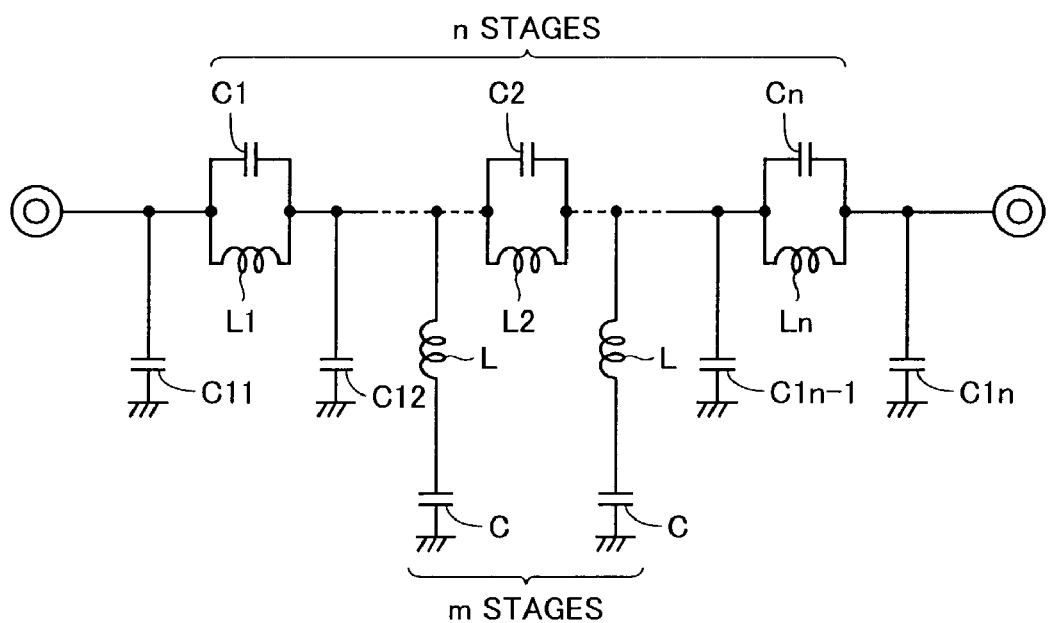
FIG. 6 shows an LPF according to a further embodiment of the present invention.
Figure 7:
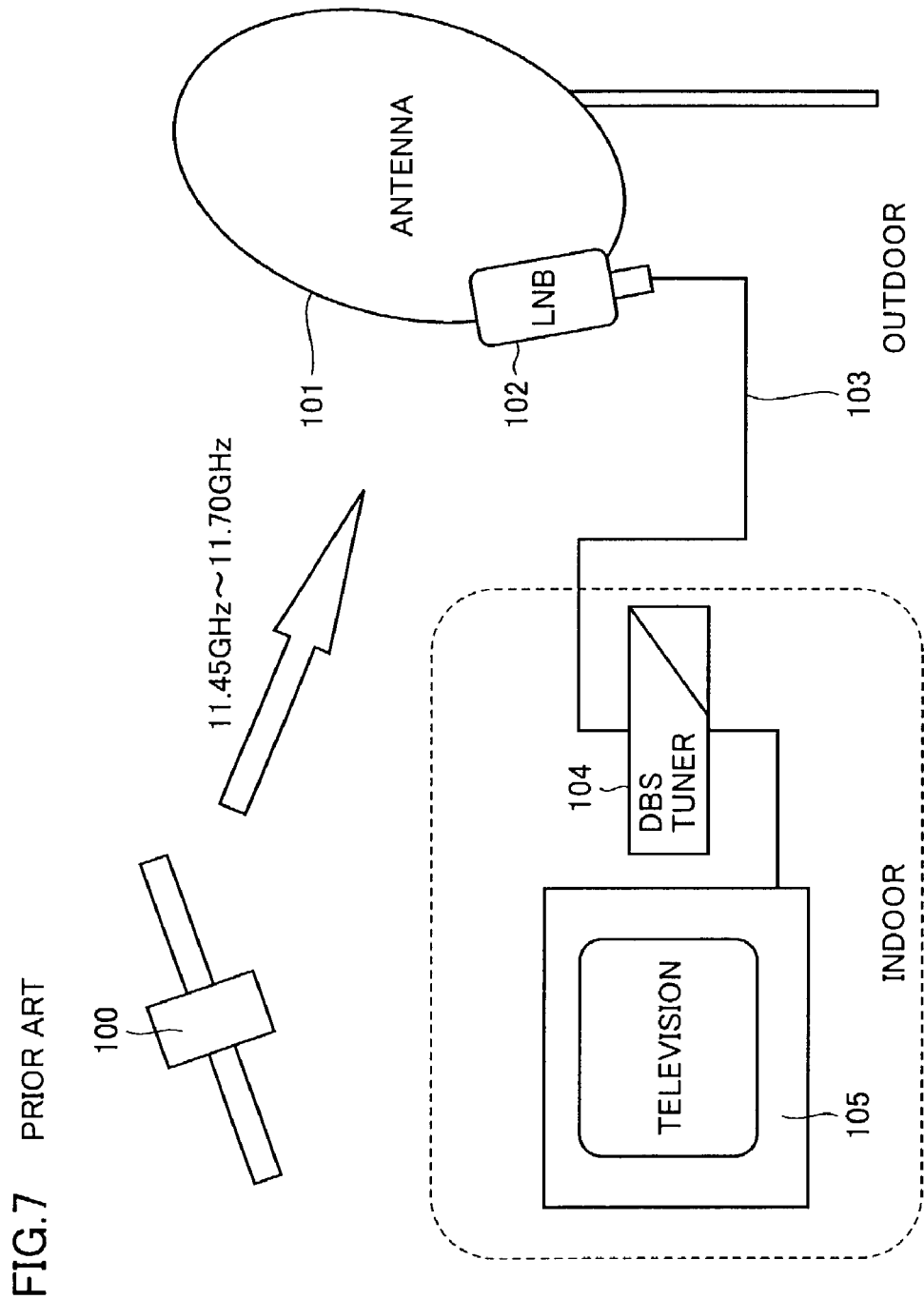
FIG. 7 is a block diagram showing a configuration of a conventional satellite broadcasting receiving system.
Figure 8:
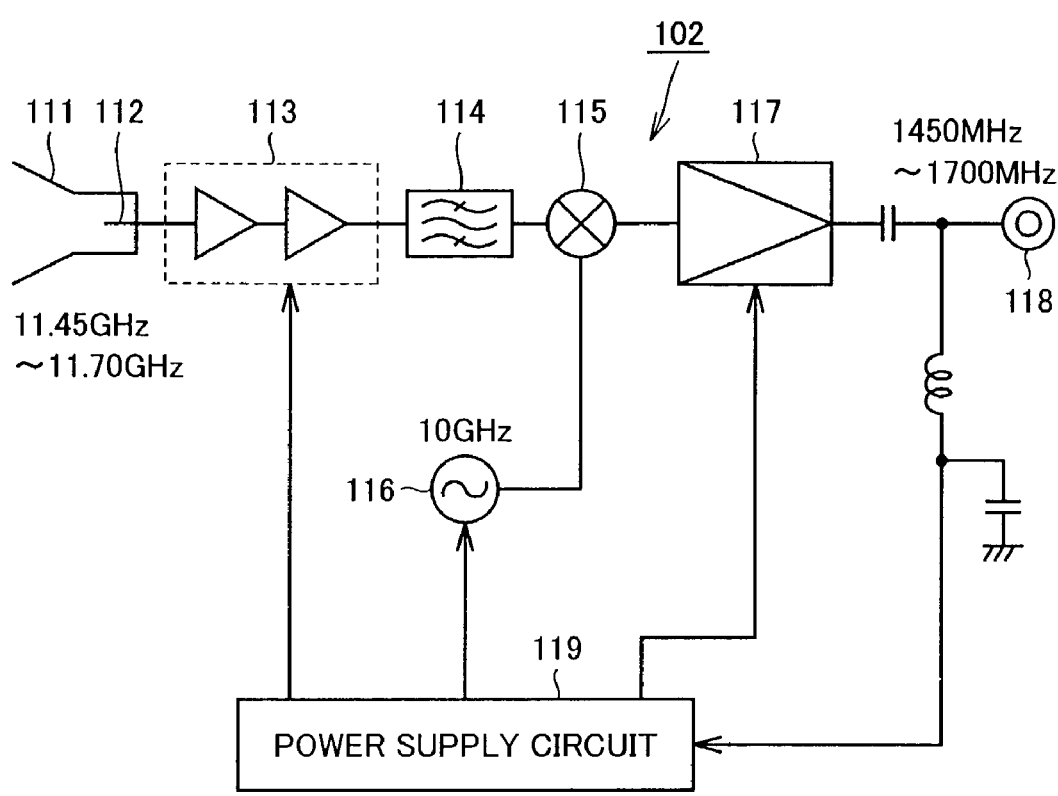
FIG. 8 is a block diagram of the low noise block downconverter shown in FIG. 7.

FIG. 6 shows an LPF according to a further embodiment of the present invention. The LPF of this embodiment corresponds to the LPF shown in FIG. 5 additionally provided with m series resonant trap circuits each having an inductor L and a capacitor C connected in series. The m series resonant trap circuits are respectively connected in parallel with the m capacitors among the n capacitors C11-C1n. In this case, although the number of inductor components cannot be reduced, even steeper attenuation becomes possible and the attenuation in the reject band increases.

Figure 9:
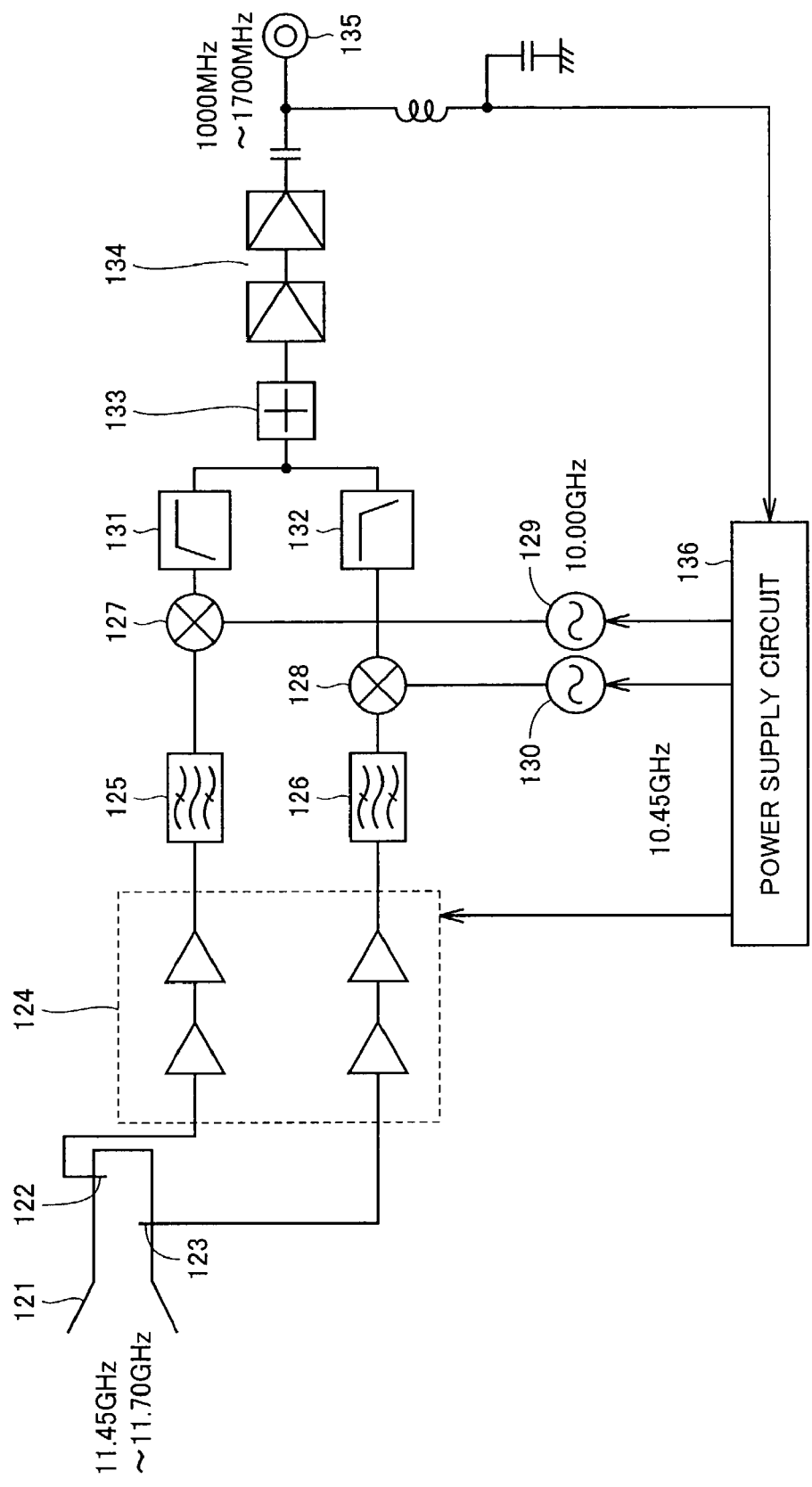
FIG. 9 is a block diagram of a band stack LNB.
Figure 10:
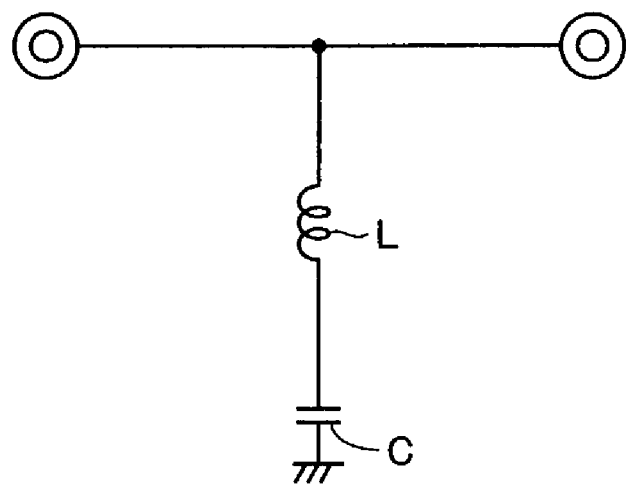
FIG. 10 shows a series resonant trap circuit.

LPF 132 has been inserted into the H polarized wave side in LNB shown in FIG. 9. Alternatively, the intermediate frequency on the V polarized wave side may be set lower than that of the H polarized wave side and the LPF may be inserted into the V polarized wave side.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A low noise block downconverter converting a received right-hand (or horizontally) polarized wave signal and a received left-hand (or vertically) polarized wave signal to intermediate frequency signals, comprising:
   a first circuit outputting said received right-hand (or horizontally) polarized wave signal;
   a second circuit outputting said received left-hand (or vertically) polarized wave signal;
   a first local oscillator circuit outputting a first local oscillation signal;
   a second local oscillator circuit outputting a second local oscillation signal;
   a first mixer circuit mixing the right-hand (or horizontally) polarized wave signal output from said first circuit and the first local oscillation signal from said first local oscillator circuit to output the intermediate frequency signal;
   a second mixer circuit mixing the left-hand (or vertically) polarized wave signal output from said second circuit and the second local oscillation signal from said second local oscillator circuit to output the intermediate frequency signal;

a first filter for removing interference waves from the output of said first mixer circuit; and a second filter for removing interference waves from the output of said second mixer circuit;

one of said first and second filters including a plurality of stages of parallel resonant trap circuits, wherein the one of said first and second filters is a low pass filter including said parallel resonant trap circuit and a series resonant trap circuit.

2. A low noise block downconverter converting a received right-hand (or horizontally) polarized wave signal and a received left-hand (or vertically) polarized wave signal to intermediate frequency signals, comprising:

a first circuit outputting said received right-hand (or horizontally) polarized wave signal;

a second circuit outputting said received left-hand (or vertically) polarized wave signal;

a first local oscillator circuit outputting a first local oscillation signal;

a second local oscillator circuit outputting a second local oscillation signal;

a first mixer circuit mixing the right-hand (or horizontally) polarized wave signal output from said first circuit and the first local oscillation signal from said first local oscillator circuit to output the intermediate frequency signal;

a second mixer circuit mixing the left-hand (or vertically) polarized wave signal output from said second circuit and the second local oscillation signal from said second local oscillator circuit to output the intermediate frequency signal;

a first filter for removing interference waves from the output of said first mixer circuit; and a second filter for removing interference waves from the output of said second mixer circuit;

one of said first and second filters including a plurality of stages of parallel resonant trap circuits, wherein the one of said first and second filters is formed of three stages of parallel resonant trap circuits connected in series.

* * * * *